United States Patent [19]

Nakagawa

[11] Patent Number: 5,329,145
[45] Date of Patent: Jul. 12, 1994

[54] HETEROJUNCTION BIPOLAR TRANSISTOR AND ITS INTEGRATION METHOD

[75] Inventor: Atsushi Nakagawa, Katano, Japan

[73] Assignee: Matsushita Electric Industrial Co., Ltd., Osaka, Japan

[21] Appl. No.: 925,965

[22] Filed: Aug. 5, 1992

[30] Foreign Application Priority Data

Oct. 15, 1991 [JP] Japan .................................. 3-265879

[51] Int. Cl.$^5$ ..................... H01L 29/72; H01L 29/205
[52] U.S. Cl. ........................................ 257/198; 257/23; 257/26; 257/197; 257/575
[58] Field of Search ................. 257/23, 26, 197, 198, 257/575

[56] References Cited

FOREIGN PATENT DOCUMENTS 1-5063  1/1989  Japan .................................. 257/197

OTHER PUBLICATIONS

Jalali et al, *Appl. Phys. Lett* (23) 5 Jun. 1989 "Near-Ideal . . . Epitaxy" pp. 2333-2335.
Kyano et al. *IEDM* 1990 "High Gain in Transistors" pp. 28.3.1-28.3.4.

*Primary Examiner*—Jerome Jackson
*Attorney, Agent, or Firm*—Shea & Gould

[57] ABSTRACT

There is disclosed a heterojunction bipolar transistor (HBT) which operates as either the emitter top mode performance or the collector top mode performance and also operates for low power dissipation due to lower ON voltages. A high gain, ultra-high speed semiconductor device is also disposed which includes a collector top type pnp HBT as a switching transistor and a lateral npn bipolar transistor as a current injection source, together with an integration method thereof which meets high density requirement with simple processes. The HBT is implemented with an InP substrate and a collector or emitter layer of p type $In_xAl_{1-x}As$ lattice matched at least to the InP substrate, a base layer of n type $In_xGa_{1-x}As$, a first spacer layer interposed between the base and collector and a second spacer layer between the base and emitter, both the spacer layers being made of p type $In_xGa_{1-x}As$ wherein by introducing of material which serves as an n impurity, the external base region is formed by the n type $In_xGa_{1-x}As$ and the resulting n type $In_xAl_{1-x}As$. There is further provided an I$^2$L circuit which comprises a HBT collector layer and a HBT emitter layer both of p type $In_xAl_{1-x}As$ lattice matched to an InP substrate and a HBT base layer of n type $In_xGa_{1-x}As$. By introduction of an n type impurity a HBT external base region is formed by the n type $In_xGa_{1-x}As$ and the resulting n type $In_xAl_{1-x}As$, together with a BT collector region and a BT emitter region of n type $In_xAl_{1-x}As$, wherein the BT base is common to the HBT collector and connected to a contact layer of p type $In_xGa_{1-x}As$.

13 Claims, 11 Drawing Sheets $qV_{bi}1 \approx qV_{bi}1 + qV_{bi}1' = E_g1 - \Delta E_c - (E_f - E_v) - (E_c - E_f)$ $qV_{bi}2 = E_g1 - (E_f - E_v) - (E_c - E_f)$ $q(V_{bi}2 - V_{bi}1) \approx \Delta E_c \approx 0.5 eV$

C = COLLECTOR
B = BASE
E = EMITTER

☒ Si ION IMPLANTED REGION

Be ION IMPLANTED REGION

HETEROJUNCTION BIPOLAR TRANSISTOR AND ITS INTEGRATION METHOD

BACKGROUND OF THE INVENTION

1. Field of the Invention

This invention relates to a heterojunction bipolar transistor and its integration method and its manufacturing method.

2. Description of the Prior Art

Heterojunction bipolar transistors (HBT) have attracted a great degree of attention as the next generation of very-high speed devices which enjoy large current driving capabilities and excellent high frequency characteristics. In his article "Heterojunction Bipolar Transistors and Integrated Circuits," Proc. IEEE., Vol. 70, P. 13, 1982, H. Kroemer reported that the collector top type of heterojunction bipolar transistors HBT with a collector on the top of the devices are more favorable than the conventional emitter top type heterojunction bipolar transistors HBT with an emitter on the top thereof, because the former provides ease of implementing of high gain and high speed Integrated Injection Logic (I²L) reduction of the area of base collector junctions, highly reliable high frequency performance, ease of implementing of grounded-emitter circuits, and so forth.

Of the collector top type heterojunction bipolar transistors, heterojunction bipolar transistors with a symmetric structure where the collector is also made up of a wide-gap material in relation with the base are in greatest demand, because they are beneficial to the application of I²L and Emitter Coupled Logic (ECL) circuits. This is especially due to the capability to execute not only collector top performance but also emitter top performance. A feature of I²L gates that the need of an isolation region may be eliminated by reversing the roles of the emitter and the collector in the conventional npn bipolar transistor to permit use as emitter-ground circuit and commonly using a n+ type substrate and that fundamental gates may be implemented without resistors by using pnp bipolar transistors as a current injection source. I²L gates are, therefore, thought to meet high density and low power consumption requirements. As a matter of fact, I²L gates were proposed where the collector top type or symmetric structure npn heterojunction bipolar transistors (HBT) are used as switching transistors and lateral pnp bipolar transistors (BT) as a current injection source, in an attempt to develop high gain, high speed and easy-to-manufacture I²L gate integrated circuits.

P. M. Asbeck et al. reported in their article "GaAlAs/GaAs Heterojunction Bipolar Transistor Device and IC Technology for High-Performance Analog and Microwave Applications," IEEE Trans. Microwave Theory Tech., Vol. 37, P. 2032, 1989, that ON voltages of the base-to-emitter diodes of AlGaAs/GaAs heterojunction bipolar transistors were 1.35 V and about 60% higher than those of Si bipolar transistors (about 0.8 V), causing the problem of an increase in power dissipation.

H. Kroemer pointed out in his report problems with integration of the conventional heterojunction bipolar transistors that element-to-element wirings are complex and the necessity of isolation regions between individual transistors hampers higher density integration.

A first prior art heterojunction bipolar transistor proposed by H. Kroemer was to implement heterojunction bipolar transistors with a symmetric structure. This sort of bipolar transistor was also reported by S. Tiwari et al. in "Symmetric-Gain, Zero-Offset, Self-Aligned, and Refractory-Contact Double HBT's," IEEE Electron Device Lett., Vol. 9, P. 417, 1987. FIG. 12 is a cross-sectional view of a first conventional symmetric structure NpN type heterojunction bipolar transistor device. Disposed on a semi-insulating GaAs substrate 21 is an epitaxial growth structure which consists of a first contact layer 22 of highly doped n type GaAs, a collector or emitter layer 23 of n type AlGaAs, a base layer 24 of highly doped p type GaAs, a collector or emitter layer 25 of n type AlGaAs and a second contact layer 26 of highly doped n type GaAs stacked sequentially on the named order.

To form a base electrode, a portion of the second contact layer 26 and a portion of the emitter or collector layer 25 which are located on an external base region are removed by a wet etching technology using a solution of sulfuric acid and hydrogen peroxide or the like or the dry etching technology using chlorine gas or the like. Be ion implantation step completes the setup of the external base region 24a. An interelement isolation region 27 and an interelement isolation 28 are defined by implanting boron and proton ions, respectively. The final step is to deposit a collector/emitter electrode 9a, the base electrode 9b and an emitter/collector electrode 9c.

A second heterojunction bipolar transistor as discussed hereinafter was proposed as a solution to the second problem in an attempt to lower the ON voltage of the base-to-emitter diode. FIG. 13 is an energy band diagram of the second prior art heterojunction bipolar transistor which is typically an NpN type heterojunction bipolar transistor of an InGaAs/InAlAs system disposed with lattice matching on an InP substrate. This device structure comprises a grading layer which helps in reducing the ON voltage of the base-to-emitter diode. The illustrated structure includes an emitter 133 of n type $In_xAl_{1-x}As$ (x=0.52), a base 144 of p type $In_xGa_{1-x}As$ (x=0.53) and a collector 155 of n type $In_xGa_{1-x}As$ (x=0.53). Particularly, the grading layer 133a is disposed between the emitter 133 and the base 144, the composition of which varies continuously from n type $In_xAl_{1-x}As$ (x=0.52) to n type $In_xGa_{1-x}As$ (x=0.53). It is evident from FIG. 7 which shows an energy band diagram, that a barrier V against carriers between the base 144 and the emitter 133 (i.e., electrons) becomes lower due to the presence of the grading layer 133a, so that the built-in voltage of the diode becomes smaller and the ON voltage becomes lower.

In the first prior art symmetric structure heterojunction bipolar transistor as depicted in FIG. 12, the difference between the ON voltage of the external base 24a and the emitter 23 and the ON voltage of the diode between the internal base 24 and the emitter would be as low as 0.3 V in view of the materials used therein. Therefore, the diode between the external base 24a and the emitter 23 would turn On at high collector current densities of over several $10^4 A/cm^2$, thereby developing an abrupt drop in current gain.

To suppress Be diffusion during the step of high temperature annealing by which the crystalline statue is recovered after ion implantation, it is necessary to keep the Be doping concentration between 3 and $5 \times 10^{18}/cm^3$. Should Be be doped at a higher concentration than the specified scope, Be would be diffused during the annealing step so that the n type AlGaAs 23 would turn into p type and the heterojunctions between the p type GaAs 24 and the n type AlGaAs 23 and 25 would be destroyed with the accompanying development of a homojunction between the n type AlGaAs and the p type AlGaAs with a lower efficiency of carrier injection. As a consequence, the first prior art heterojunction bipolar transistor can not sufficiently lower the base resistance as compared with the emitter top type so that it may not take full advantage of the excellent high frequency characteristics of the collector top type transistor.

As mentioned above, to make smaller the built-in voltage of the base-emitter junction, the second prior art heterojunction bipolar transistor has the grading layer the composition of which varies continuously from $In_xAl_{1-x}As$ (x=0.53) to $In_xGa_{1-x}As$ (x=0.52). In essence, the manufacturing of such grading layer which matches in lattice with the InP substrate is very difficult.

To improve integration density, an I²L gate was proposed which uses a heterojunction bipolar transistor, in an article "Double Heterojunction GaAs/GaAlAs I²L Inverter," by P. Narozy et al, Electron. Lett., Vol. 21, P. 328, 1985. FIGS. 14(A) and 14(B) show an equivalent circuit diagram and a cross sectional view of the I²L gate device reported therein, respectively. There is disposed an epitaxial layered structure on a semi-insulating GaAs substrate 111, which structure consists of a first contact layer 112 of highly doped n type GaAs, an emitter layer 113 of n type AlGaAs, a base layer 114 of highly doped p type GaAs, a collector layer 115 of n type GaAs and a second contact layer 116 of highly doped n type GaAs, sequentially deposited in the named order. To form a collector mesa structure, the second contact layer 116 and the collector layer 115 are removed partially for a buildup of an external base region by the wet etching technology using a solution of sulfuric acid and hydrogen peroxide or the like or the dry etching technology using chlorine gas or the like. The subsequent Be ion implantation and thermal treatment for recovery of crystalline state result in buildup of the external base region of an npn heterojunction bipolar transistor and buildup of a collector region 114a or an emitter region 114b of a lateral pnp bipolar transistor. After formation of a base mesa structure through the use of the same etching technology as mentioned above, a base electrode of the heterojunction bipolar transistor or a collector electrode 110a of the lateral bipolar transistor, an emitter electrode of the heterojunction bipolar transistor or a base electrode 110b of the lateral bipolar transistor, an emitter electrode 110c of the lateral bipolar transistor and a collector electrode 110d of the heterojunction bipolar transistor are deposited, respectively. Measurements at high collector current densities revealed that the external base-emitter diode turned ON in the above mentioned materials at high collector current densities over several $10^4 A/cm^2$, causing a sharp drop in current gain, because the difference between the ON voltage of the external base-emitter diode and the ON voltage of the intrinsic base-emitter diode was as low as 0.2 V–0.3 V in the collector top type npn heterojunction bipolar transistor used in the prior art I²L gate device. As discussed above, to suppress Be diffusion during the step of high temperature annealing by which the crystalline state is recovered after ion implantation, it is necessary to keep the Be dopings between 3 and $5 \times 10^{18}/cm^3$. As a consequence, the prior art collector top type heterojunction bipolar transistor can not sufficiently lower the base resistance as compared with the emitter top type so that it may not take full advantage of the excellent high frequency characteristics of the collector top type transistor. The hole mobility of the AlGaAs layer which forms the base of the lateral pnp bipolar transistor is as low as 100 cm²/V sec and the diffusion length of the minority carriers is as low as about 0.5 μm. To assume sufficient current gain, the thickness of the base needs to be less than 0.1 μm. The profile of the p type AlGaAs intervening between the collector and emitter regions of the n type AlGaAs corresponds to the thickness of the base and needs to be less than about 0.1 μm. Such requirement is difficult to meet even when the state-of-art technology is utilized.

SUMMARY OF THE INVENTION

A primary object of the present invention is to provide a heterojunction bipolar transistor which not only may enjoy high frequency characteristics without suffering from drop in current gain but also attain low power consumption performance due to low ON voltages by simple manufacturing processes and also perform in either of the two modes of operation, emitter top mode or collector top mode.

Another object of the present invention is to provide a method of integrating heterojunction bipolar transistors with integration density enhancement.

To achieve the above mentioned objects, the present invention provides a heterojunction bipolar transistor which comprises an InP substrate and an expitaxial layered structure thereon, said epitaxial layered structure including a collector or emitter layer of p type $In_xAl_{1-x}As$ lattice matched at least to the InP substrate, a base layer of n type $In_xGa_{1-x}As$ and an emitter or collector layer of p type $In_xAl_{1-x}As$ lattice matched to the InP substrate. By introducing from a surface of the base layer material which serves as an n impurity, the p type $In_xAl_{1-x}As$ underneath the base layer is turned to an n type region for a setup of an external base region. The external base region is formed by the n type $In_xGa_{1-x}As$ and the resulting n type $In_xAl_{1-x}As$. A plurality of the heterojunction bipolar transistors made according to the present invention are integrated on the single collector or emitter layer of the p type $In_xAl_{1-x}As$ at the lowest layer. Some of the transistors are rendered to operate as the emitter top type and others of the transistors as the collector top type.

With the above mentioned arrangement, the heterojunction bipolar transistors of an InGaAs/InAlAs system on the InP substrate offer the following operations and effects:

(1) By the introduction of the n type dopant, the difference between the ON voltage of an external base-emitter diode formed in a wide-gap semiconductor material and the ON voltage of an intrinsic base-emitter diode is widened to about 0.5 V. This will be explained referring to FIGS. 7(A) and 7(B). The built-in voltage $V_{bi}2$ of the external base-emitter (N-InAlAs/P-InAlAs) junction in FIG. 7(B) and the built-in voltage $V_{bi}1$ of the internal base-emitter (n-InGaAs/P-InAlAs) junction may be represented as follows (assuming that the doping of the base is substantially heavier than that of the emitter):

$$qV_{bi}1 \approx E_g1 - \Delta E_c - (E_f - E_v) - (E_c - E_v) \qquad (1)$$

$$qV_{bi}2 = E_g1 - (E_f - E_v) - (E_c - E_v) \qquad (2)$$

$$q(V_{bi}2 - V_{bi}1) \approx \Delta E_c \approx 0.5 eV \quad (3)$$

It is made possible to sufficiently suppress hole injection from the external base-emitter diode, because the difference $q(V_{bi}2-V_{bi}1)$ is as large as a conduction band offset $\Delta E_c$ (0.5 eV) of a heterojunction of an InAlAs/InGaAs system. It is, therefore, possible to keep the external base-emitter diode in OFF state at high collector current densities and prevent current gain from dropping. Where Si is used as an n type dopant for the base layer, its diffusion constant is smaller than that of Be so that the dopant is stable even during the high temperature annealing step. The base-emitter built-in voltage is 0.9-1.0 V and small as compared with that of bipolar transistors, enabling low power dissipation operation with smaller ON voltages.

(2) The introduction of the material as the n type impurity allows the formation of the external base region without the need to expose the intrinsic base region directly, permitting the manufacturing of transistors with very thin thickness of the base on the order of several 10 nm.

(3) High speed operation is available in the PnP type transistor where holes of low mobility run due to very thin thickness of the base as mentioned above. A thin spacer layer of p type $In_xGa_{1-x}As$ intervened between the base and collector lowers the height of a spike-like barrier occurring at a valent band in the $In_xGa_{1-x}As/In_xAl_{1-x}As$ heterojunction region and facilitates the traveling of holes from the base to the collector.

(4) The heterojunction bipolar transistor according to the present invention has unique features that high speed operation is available with low power consumption and it operates either in the emitter top type or the collector top type.

An integration method by which the single collector or emitter region of the p type $In_xAl_{1-x}As$ at the lowest layer is used commonly for integration of a number of the heterojunction bipolar transistors according to the present invention and some of these transistors are used as the emitter top type and others as the collector top type offers, unique features that the number of wirings between the elements may be reduced and the need for element-to-element isolation regions may be eliminated, thereby facilitating high density integration of transistors with high efficiency.

Still another object of the present invention is to provide a semiconductor device including a collector top type pnp HBT and a lateral npn BT and a method of manufacturing the semiconductor device, wherein the collector top type pnp HBT exhibits a significant difference between the ON voltage of an external base-emitter diode and that of an internal base-emitter diode and does not suffer from deteriorated characteristics during high temperature thermal treatment, while the lateral npn BT is easy to manufacture because of its longer diffusion length of the minority carriers in the base.

To accomplish the above mentioned object, the present invention provides a semiconductor device comprising a collector top type pnp HBT and a lateral npn BT wherein the collector top type pnp HBT is used as a switching transistor and the lateral npn BT as a current injection source. The collector top type pnp HBT comprises an InP substrate and an epitaxial layered structure thereon, said epitaxial layered structure including a collector layer of p type $In_xAl_{1-x}As$ matching in lattice at least with the InP substrate, a base layer of n type $In_xGa_{1-x}As$ and an emitter layer of p type $In_xAl_{1-x}As$ lattice matched to the InP substrate.

By introducing into an external base region material which serves as an n impurity, the p type $In_xAl_{1-x}As$ beneath the base layer is turned to an n type region for formation of the external base region. The external base region is defined by the n type $In_xGa_{1-x}As$ and the resulting n type $In_xAl_{1-x}As$.

Turning to the lateral npn BT, the p type $In_xAl_{1-x}As$ layer adjacent to but spaced from the n type $In_xAl_{1-x}As$ layer in the external base region is turned into n type $In_xAl_{1-x}As$ by introduction of material which serves as an n type impurity. The lateral npn BT where electrons run laterally, comprises a collector formed of the n type $In_xAl_{1-x}As$ portion in the external base region of the HBT, an emitter formed of the n type $In_xAl_{1-x}As$ spaced from the collector and a base formed of the p type $In_xAl_{1-x}As$ interposed between the collector and emitter.

A method of manufacturing a semiconductor device according to the present invention comprises the steps of introducing an n type impurity using a dummy pattern as a mask; and removing the dummy pattern and the p type $In_xGa_{1-x}As$ or the p type $In_xAl_{1-x}As$ beneath the dummy pattern and the n type $In_xGa_{1-x}As$, thereby forming the lateral npn BT.

The $I^2L$ gate comprising the collector top type pnp HBT and the lateral npn BT offers the following operations and effects:

(1) Turning the collector top type pnp HBT of the InAlAs/InGaAs materials, the difference between the ON voltage of an external base-emitter diode formed in a wide-gap semiconductor material and the ON voltage of an intrinsic base-emitter diode is widened to about 0.5 V due to the introduction of the n type dopant. It is, therefore, possible to keep the external base-emitter diode in OFF state even at high collector current densities and prevent current gain from dropping. Where Si is used as an n type dopant for the base layer, its diffusion constant is smaller than that of Be so that the dopant is stable even during the high temperature annealing step. Further, the introduction of the material as the n type impurity allows the formation of the external base region without the need to expose the intrinsic base region directly, thus permitting the manufacturing of transistors with very thin thicknesses of the base on the order of several 10 nm. High speed operation is, therefore, available in spite of the PnP type transistor.

(2) The diffusion length of the minority carriers in the base of the lateral npn BT where the electrons run is three times longer than that of the pnp type, making it possible and easy to define the base region with the lithography technology of a resolution of about 0.3 μm.

(3) Through the use of the method of manufacturing the npn BT by which the collector and emitter regions are self-aligning formed with the dummy pattern placed on the base region as a mask, the manufacturing process of the semiconductor device is simplified because the manufacturing of the npn BT proceeds at the same time as that of the other element or the collector top type pnp HBT.

Pursuant to the present invention, the symmetric structure PnP heterojunction bipolar transistor of the $In_xAl_{1-x}As/In_xGa_{1-x}As$ system is implemented readily through the use of the simple step by which a diode is formed in the external base region in the wide-gap semiconductor material by Si ion implantation. The resulting heterojunction bipolar transistor offers several advantages, including low power consumption performance with lower ON voltages, outstanding high frequency characteristics due to a very thin thickness of the base and a low base resistance, and availability of two mode operations including the emitter top type and collector top type performances.

A plurality of the heterojunction bipolar transistors according to the present invention may be integrated onto the common collector region so that some of the transistors are rendered to operate as the emitter top type and others as the collector top type. With such arrangements, the number of wirings between the elements are reduced and the need for isolation regions among the elements is eliminated, thereby facilitating high density integration of the transistors with high efficiency.

In addition, a high gain, ultra-high speed $I^2L$ gate integrated circuit device is provided according to the present invention by using the collector top type pnp InAlAs/InGaAs HBT as a switching transistor and the lateral npn bipolar transistor as a current injection source, wherein the HBT exhibits not only excellent high frequency characteristics due to a very thin thickness of the base and a reduced base resistance but also static characteristics without experiencing deterioration of current gain at high collector current densities, while the lateral bipolar transistor is easy to manufacture because of a longer diffusion length of the minority carriers in the base.

A high density, high integration HBT integrated circuit device is provided according to the present invention, by which the p type $In_xAl_{1-x}As$ layer is reverted into the n type by Si ion implantation step, the collector and emitter regions of the lateral npn bipolar transistor are self-aligning formed through the use of the dummy pattern or the p type $In_{0.53}Ga_{0.47}As$ layer is commonly used to eliminate the need of an isolation region.

DETAILED DESCRIPTION OF THE PREFERRED EMBODIMENTS

Figure 1:
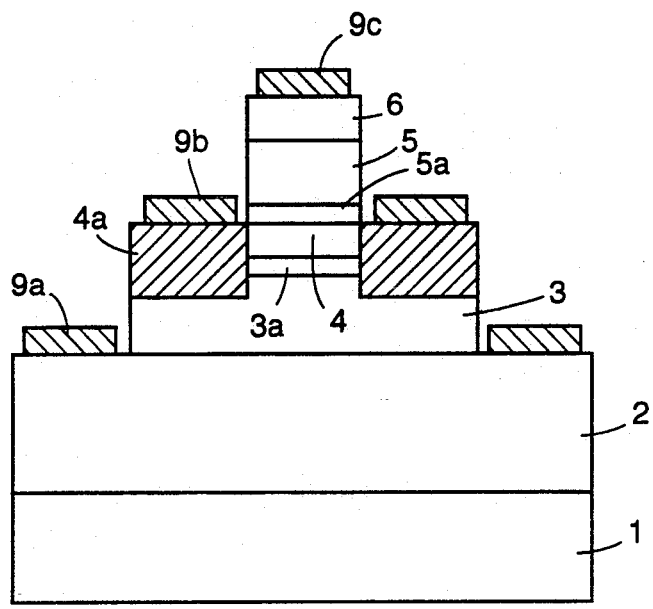
FIG. 1 is a major cross sectional view of a heterojunction bipolar transistor device according to a first embodiment of the present invention.
Figure 12:
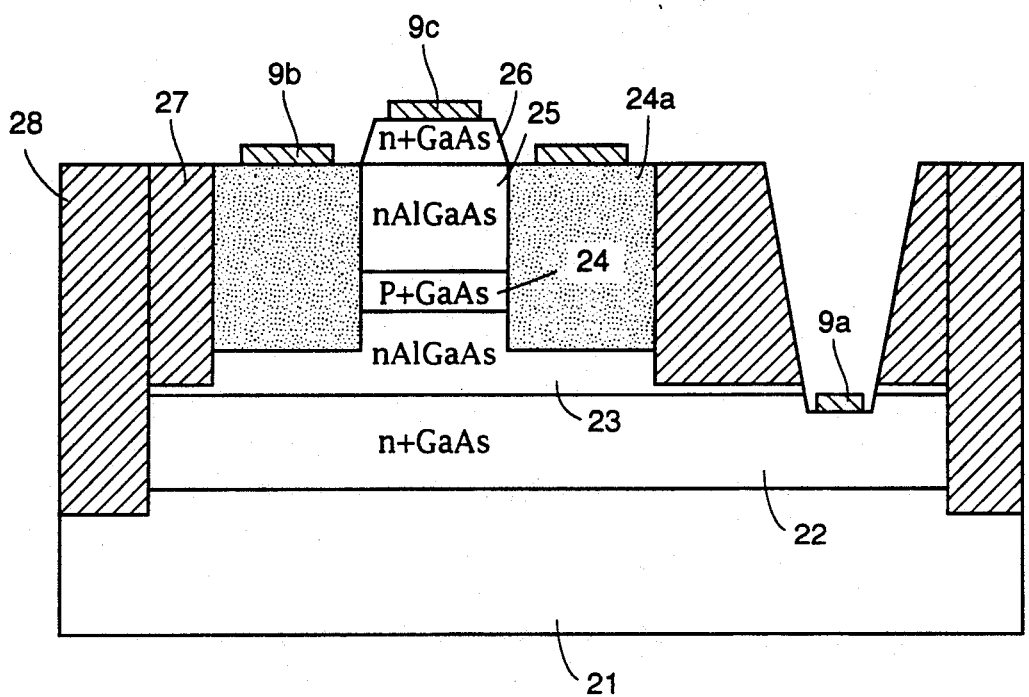
FIG. 12 is a cross sectional view of a first prior art heterojunction bipolar transistor device.
Figure 13:
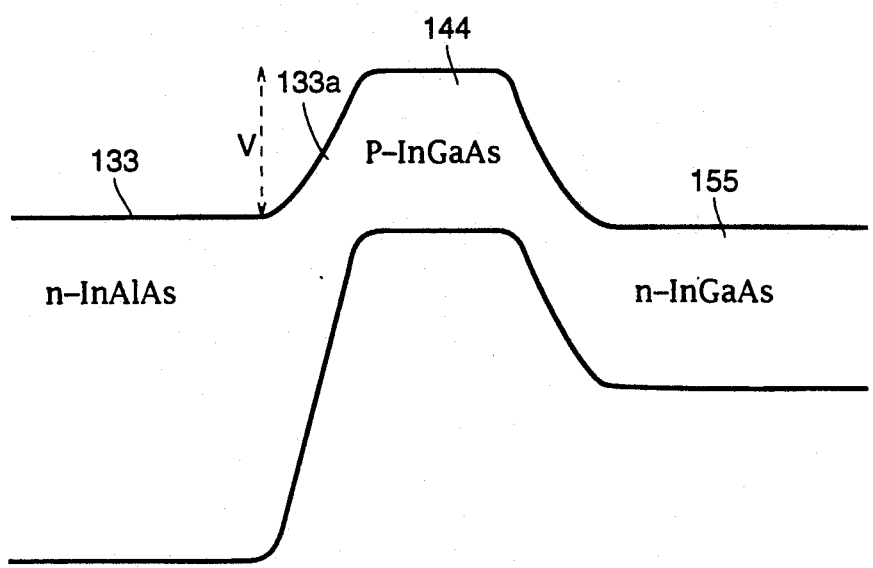
FIG. 13 is an energy band diagram showing a second prior art heterojunction bipolar transistor.

Referring first to FIG. 1, there is illustrated a major cross sectional view of a heterojunction bipolar transistor device according to a first embodiment of the present invention. The difference of the illustrated embodiment of the present invention from the first prior art device as shown in FIG. 12 lies in a symmetric structure PnP type heterojunction bipolar transistor of an $In_xAl_{1-x}As/In_xGa_{1-x}As$ system lattice matched to an InP substrate, wherein a base-emitter diode is formed in a wide-gap semiconductor material by introducing into an external base region an n type impurity.

A method of manufacturing the heterojunction bipolar transistor as shown in FIG. 1 will be described. By the molecular epitaxial growth technique, there is disposed on a semi-insulating InP substrate 1 a sequential stack including a first contact layer 2 of p type $In_{0.53}Ga_{0.47}As$ of a thickness of 500 nm including a p type impurity of $4 \times 10^{19}/cm^3$, a collector or emitter layer 3 of p type $In_{0.53}Al_{0.47}As$ of a thickness of 200 nm including a p type impurity of $2 \times 10^{17}/cm^3$, a first spacer layer $3a$ of p type $In_{0.53}Ga_{0.47}As$ of a thickness of 30 nm including a p type impurity of $2 \times 10^{17}/cm^3$, a base layer 4 of n type $In_{0.53}Ga_{0.47}As$ of a thickness of 15 nm including a n type impurity of $1 \times 10^{19}/cm^3$, a second page layer $5a$ of p type $In_{0.53}Ga_{0.47}As$ of a thickness of 30 nm including a p type impurity of $2 \times 10^{17}/cm^3$, a collector or emitter layer 5 of p type $In_{0.53}Ga_{0.47}As$ of a thickness of 200 nm including a p type impurity of $2 \times 10^{17}/cm^3$, and a second contact layer 6 of p type $In_{0.53}Ga_{0.47}As$ of a thickness of 100 nm including a p type impurity of $4 \times 10^{19}/cm^3$.

Figure 2:
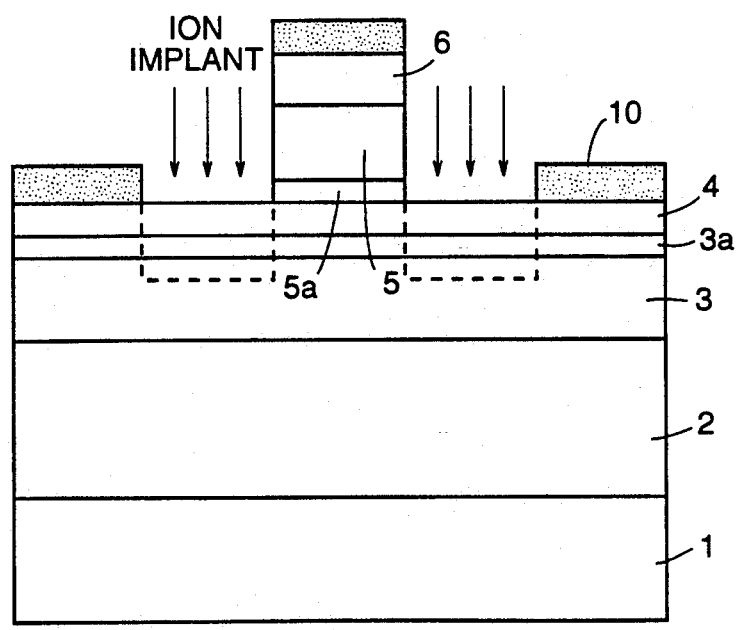
FIG. 2 is a major cross sectional view showing an ion implantation process for the heterojunction bipolar transistor according to the first embodiment of the present invention.

The thickness of the spacer layers is selected so as to define a depletion layer and maintain an n-InGaAs/p-InAlAs heterojunction even when there is applied a forward bias between the base layer 4 and the collector or emitter layer 3 or between the base layer 4 and the emitter or collector layer 5. Portions of the contact layer 6, the emitter or collector layer 5 and the second spacer layer 5a where an external base region is to be defined are etched away with a solution of phosphoric acid and hydrogen peroxide. As seen from FIG. 2, Si ions are implanted at an acceleration voltage of 100 KV and a dozing of $10^{14}/cm^3$, followed by thermal treatment at 600° C. for 10 seconds, thereby delineating the external base region 4a. Then, a base mesa structure and a collector or emitter mesa structure are sequentially formed with an etchant of phosphoric acid, for example. The final step is to deposit a collector or emitter electrode 9a, a base electrode 9b and an emitter or collector electrode 9c.

Figure 3:
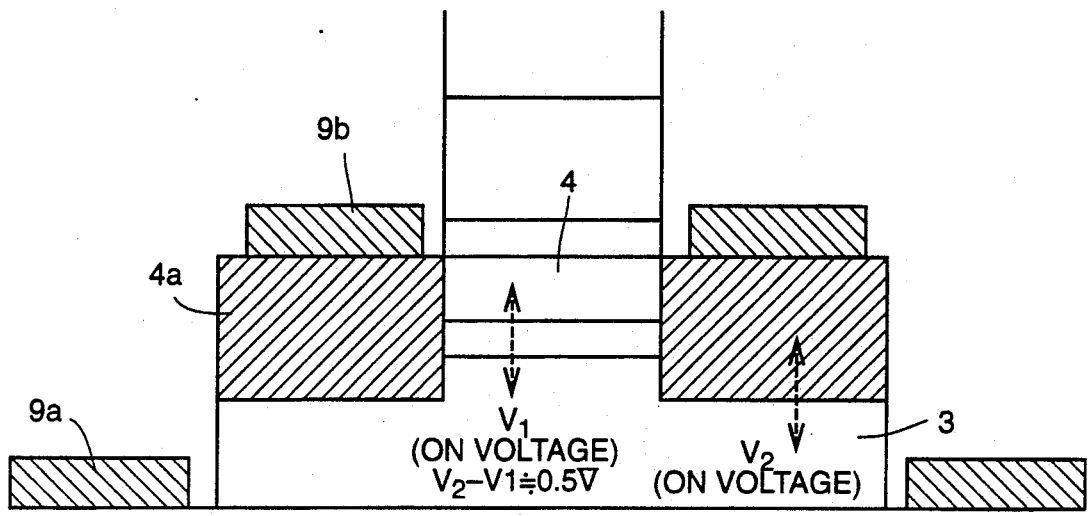
FIG. 3 is a diagram for explaining the operations of an external base-emitter diode and an intrinsic base-emitter diode in the heterojunction bipolar transistor according to the first embodiment of the present invention.
Figure 4A:
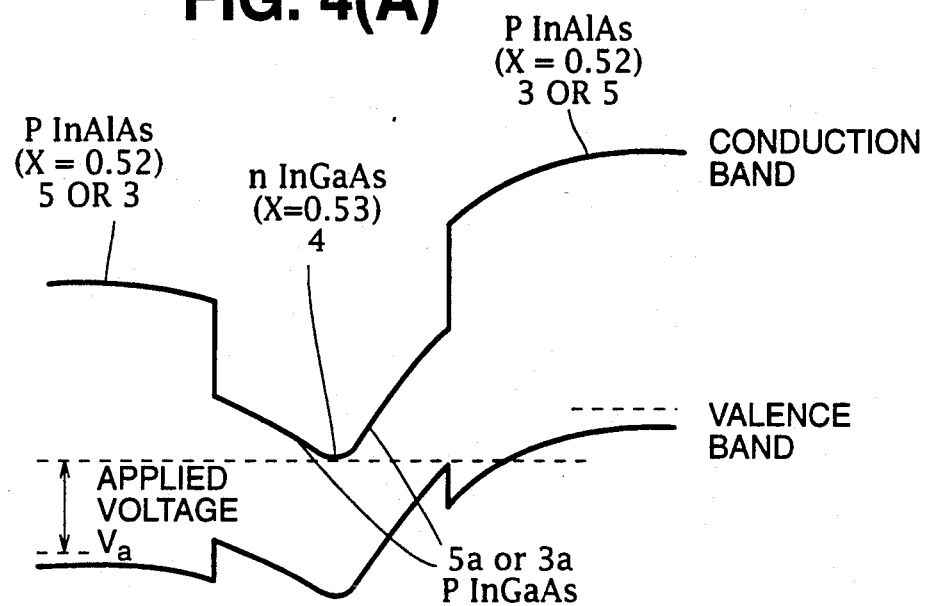
FIG. 4(A) is an energy band diagram of the heterojunction bipolar transistor as shown in FIG. 1.
Figure 4B:
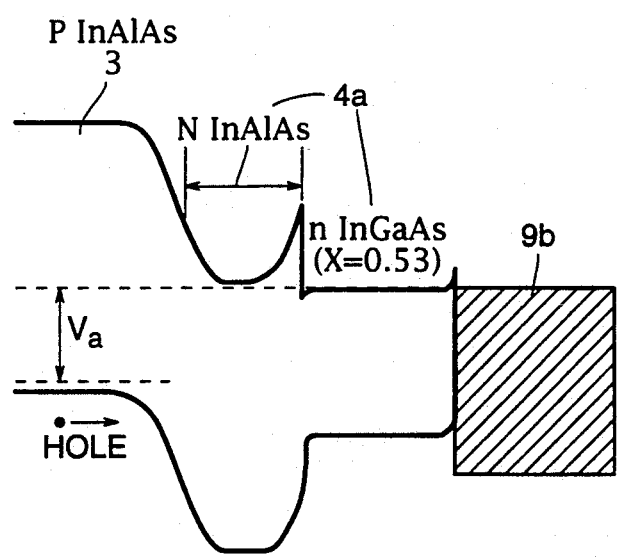
FIG. 4(B) is an energy band diagram of the base-emitter diode in the external base region during the collector up type operation.

FIG. 4(A) is an energy band diagram of the heterojunction bipolar transistor according to the first embodiment of the present invention. The built-in voltage of the intrinsic base-emitter diode is as small as 0.9-1.0 V as compared with that of Si bipolar transistors so that the ON voltage thereof may be significantly smaller than that of the first prior art heterojunction bipolar transistor as shown in FIG. 12. FIG. 4(B) is an energy band diagram of a base-emitter diode formed in the external base region 4a made up of the n type $In_{0.53}Ga_{0.47}As$ and the n type $In_{0.52}Ga_{0.48}As$ during the collector up type operation mode. The diode formed in the wide-gap semiconductor material may stay in OFF state even at high collector current densities and will not create a parasitic current with no risk of current gain drop because the built-in voltage thereof is sufficiently higher than that of the intrinsic base-emitter diode as seen from FIG. 4(B). FIG. 3 gives a better understanding of the accompanying advantageous effects. As is obvious from FIG. 3, the ON voltage $V_2$ of the external base-emitter diode is higher than the ON voltage $V_1$ of the intrinsic base-emitter diode, so that the external base-emitter diode may keep OFF when the applied voltage thereto goes beyond $V_1$ but does not reach $V_2$. Therefore, current gain will not decrease.

In general, the mobility of holes in the transistor is about 10 times slower than that of electrons. Because the base thickness in the illustrated embodiment is very thin on the order of 15 nm, the transit time $\tau b$ of the minority carriers in the base is 0.4-0.5 psec and substantially smaller than as compared with $\tau b$ of an Npn type HBT of AlGaAs/GaAs system with a base thickness of 100 nm, permitting higher speed performance. Further, the electron mobility of the base layer of the n type $In_{0.53}Ga_{0.47}As$ is about 20 times higher than the hole mobility when the p type GaAs corresponding to the base layer of the Npn type heterojunction bipolar transistor contains an impurity of $10^{19}/cm^3$. This results in that the base resistance at the intrinsic region with a thin base thickness will not increase and the apparent base thickness of the external base region will increase due to ion implantation process, thus attaining a reduction of the total base resistance. Although in the above embodiment the second spacer layer 5a is etched away in the external base region to thereby expose the intrinsic base layer, it is still possible that the spacer layer 5a may remain unetched and be reverted into n type by Si ion implantation process for buildup of the external base region. Even when the internal base thickness is very thin, precise etching control is, therefore, not necessary for the emitter layer 5 and the second spacer layer. Thus, it is much easier to built up the external base region.

Figure 5A:
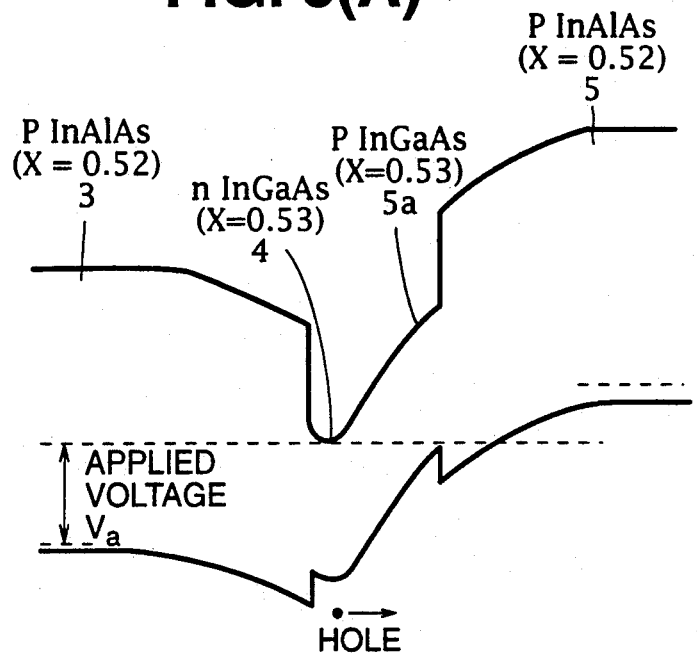
FIG. 5(A) is an energy band diagram showing a heterojunction bipolar transistor according to a second embodiment of the present invention during the collector up type operation.
Figure 5B:
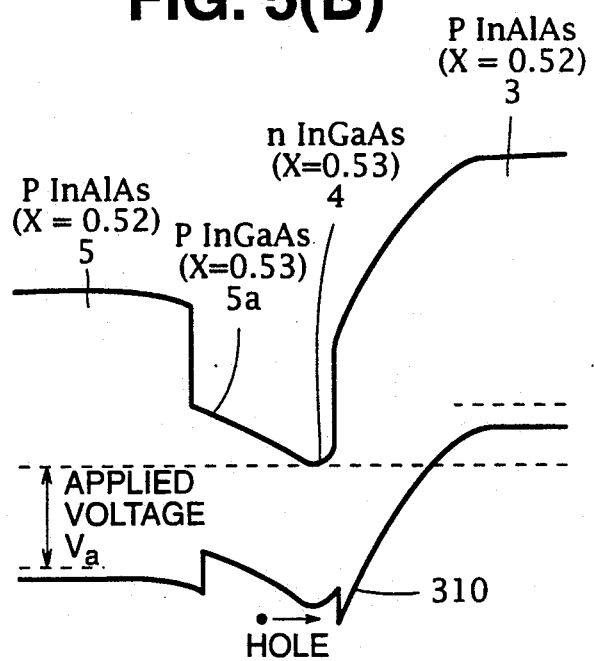
FIG. 5(B) is an energy band diagram during the emitter up type operation.
Figure 7A:
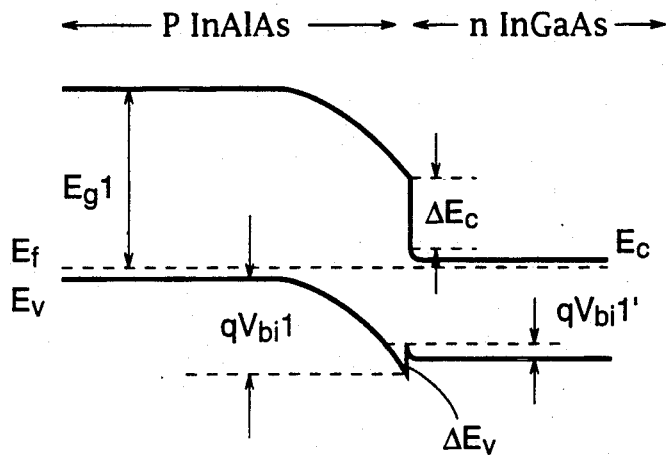
FIG. 7(A) is an energy band diagram showing an internal base-emitter heterojunction.
Figure 7B:
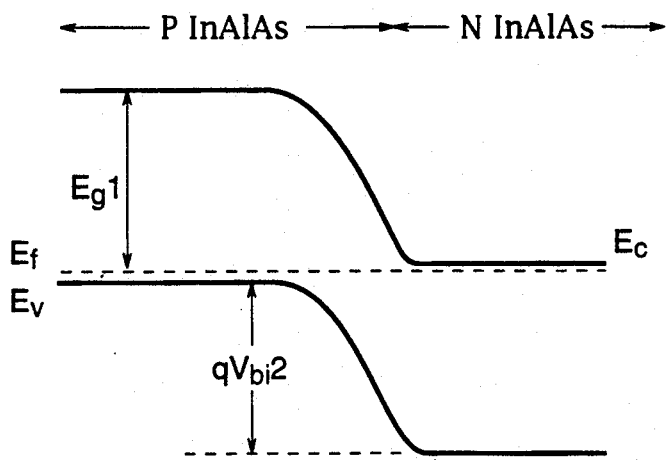
FIG. 7(B) is an energy band diagram showing an external base-emitter heterojunction.

FIGS. 5(A) and 5(B) are energy band diagrams showing a heterojunction bipolar transistor according to a second embodiment of the present invention. The difference of the second embodiment from the first embodiment is that there is no first spacer layer 3a between the collector layer 3 and the base 4 and the doping concentration of the collector layer 3 increases from $2 \times 10^{17}/cm^3$ to $7 \times 10^{17}/cm^3$. FIG. 5(A) is an energy band diagram during the collector up type mode, where basic operation is similar to that of the first embodiment, whereas during the emitter up type mode as shown in FIG. 5(B) a spike-like barrier 310 developed at the valence band between the base and collector is significantly lowered so as not to hamper travel of holes to the collector by reducing the thickness of the barrier to a minimum with heavy doping of the collector.

Figure 6:
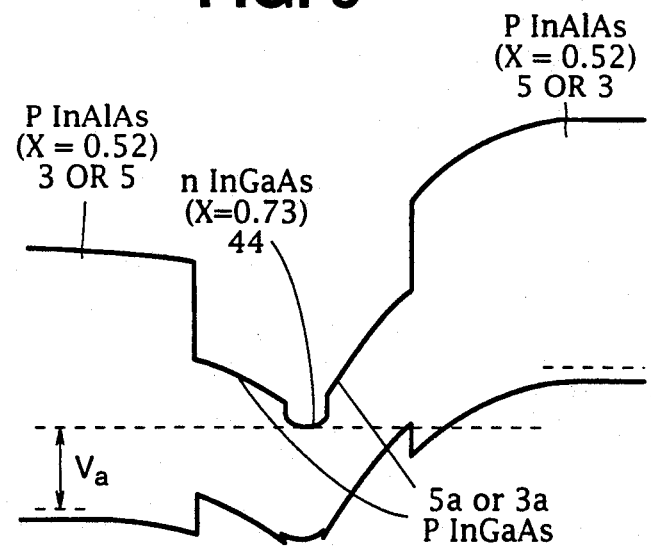
FIG. 6 is an energy band diagram showing a heterojunction bipolar transistor according to a third embodiment.

FIG. 6 is an energy band diagram showing a heterojunction bipolar transistor according to a third embodiment of the present invention. The difference of the third embodiment from the first embodiment as shown in FIG. 1 is that the composition ratio of indium is enhanced and the base layer 44 comprises n type $In_xGa_{1-x}As$ (x=0.73) not in lattice matching with the InP substrate. Even though lattice mismatching of the p type $In_{0.73}Ga_{10.27}As$ with the InP substrate amounts to about 1.3%, no dislocation will happen and a good junction will be maintained because the thickness of the base layer is 15 nm and below the critical thickness. An additional reduction of the ON voltage is possible, because the band gap of $In_{0.73}Ga_{10.27}As$ is smaller than that of $In_{0.53}Ga_{10.47}As$.

Figure 8A:
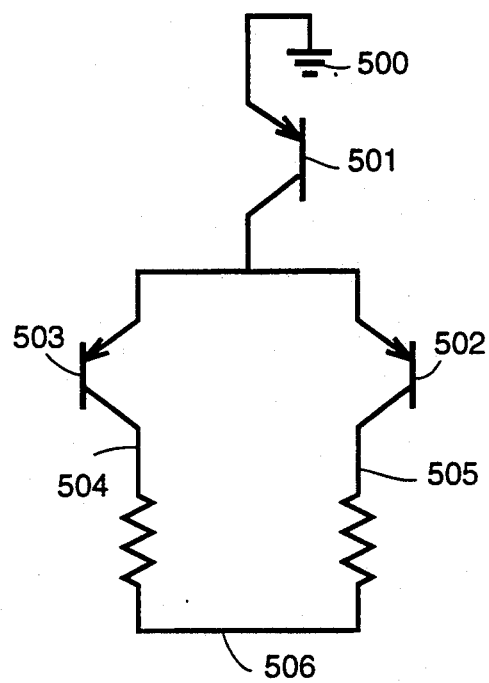
FIG. 8(A) is an ECL circuit diagram showing a first embodiment of a method of integrating heterojunction bipolar transistors according to the present invention.
Figure 8B:
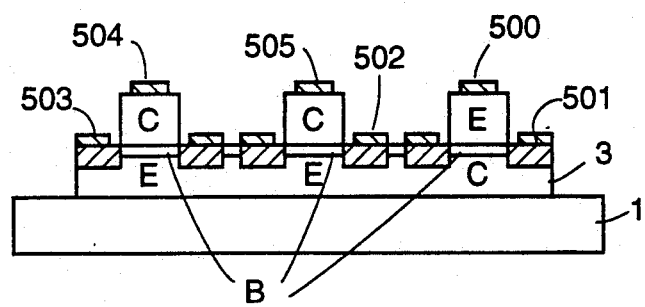
FIG. 8(B) is a cross sectional view of heterojunction bipolar transistors integrated according to the first embodiment of the method of integrating heterojunction bipolar transistors according to the present invention.

FIGS. 8(A) and 8(B) are diagrams showing a first embodiment of an integration method of the heterojunction bipolar transistors according to the present invention. FIG. 8(A) is a diagram illustrating a basic unit of an ECL circuit including three pnp transistors, wherein an input signal 503 is compared with a second reference bias 502 and the outcome of comparison is delivered via an output 504. FIG. 8(B) is a cross sectional view of a heterojunction bipolar transistor integrated circuit device according to the present invention. Three transistors are implemented on a single collector region 3 of p type $In_xAl_{1-x}As$ (x=0.52) and only the transistor connected to a ground line 500 operates as the emitter up type and the others as the collector up type. Such arrangements eliminate the need for an interelement isolation and an interelement wiring and reduce the space requirement for the basic unit of the ECL circuit.

While the embodiments of the present invention use $In_{0.53}Ga_{0.47}As$ and $In_{0.52}Al_{0.48}As$ in lattice matching with the InP substrate, the transistors would not experience deterioration of their characteristics as long as lattice mismatching is within 0.3%.

Figure 9A:
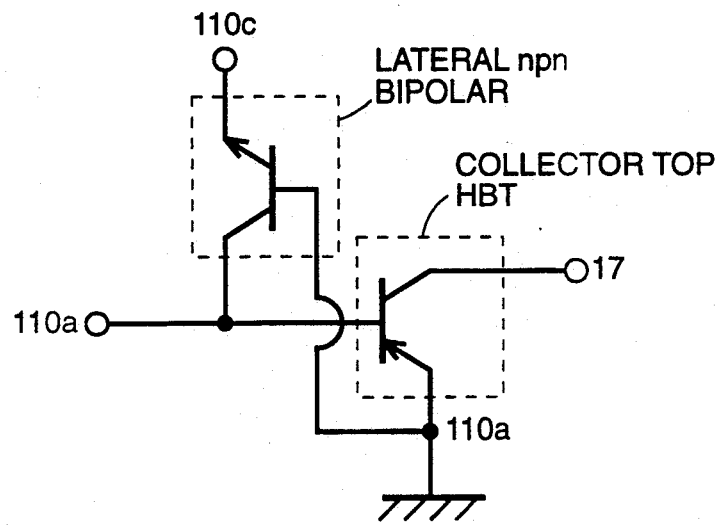
FIG. 9(A) is an equivalent circuit diagram of an $I^2L$ gate as a semiconductor device embodying the present invention.
Figure 9B:
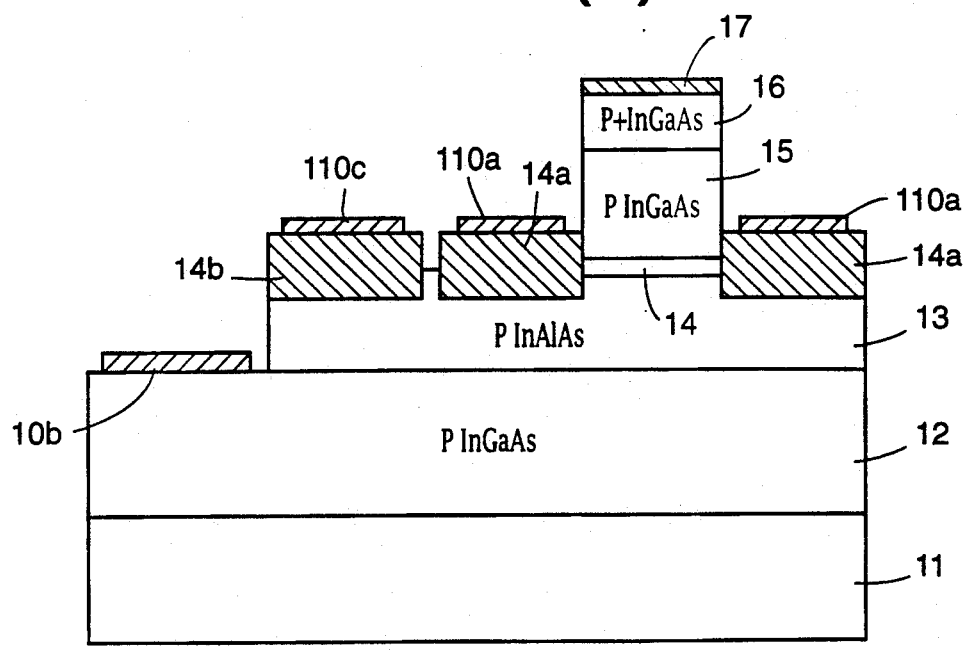
FIG. 9(B) is a major cross sectional view of an embodiment of the $I^2L$ gate.
Figure 10:
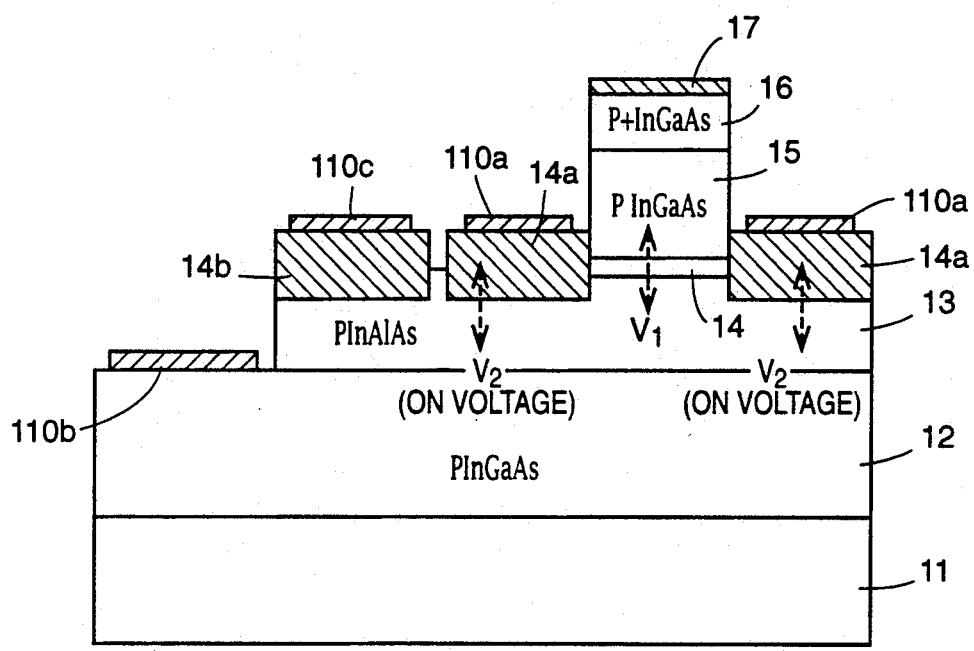
FIG. 10 is a cross sectional view of a HBT for explaining ON voltage V2 of an external base-emitter diode and ON voltage V1 of an internal base-emitter diode.
Figure 14A:
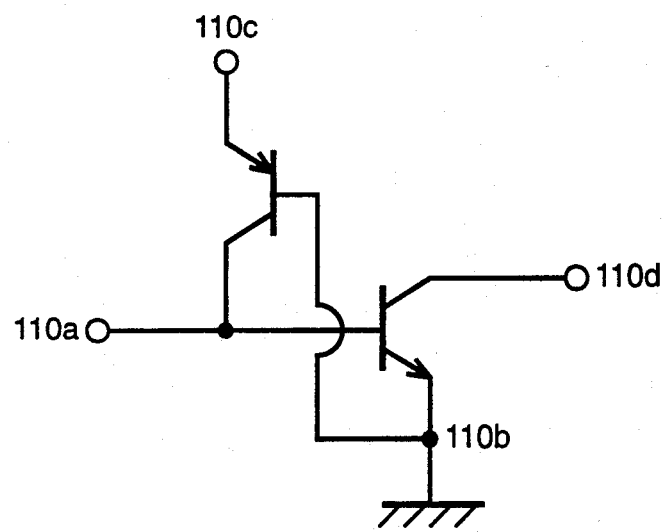
FIG. 14(A) is an equivalent circuit diagram of an $I^2L$ gate as a prior art semiconductor device.
Figure 14B:
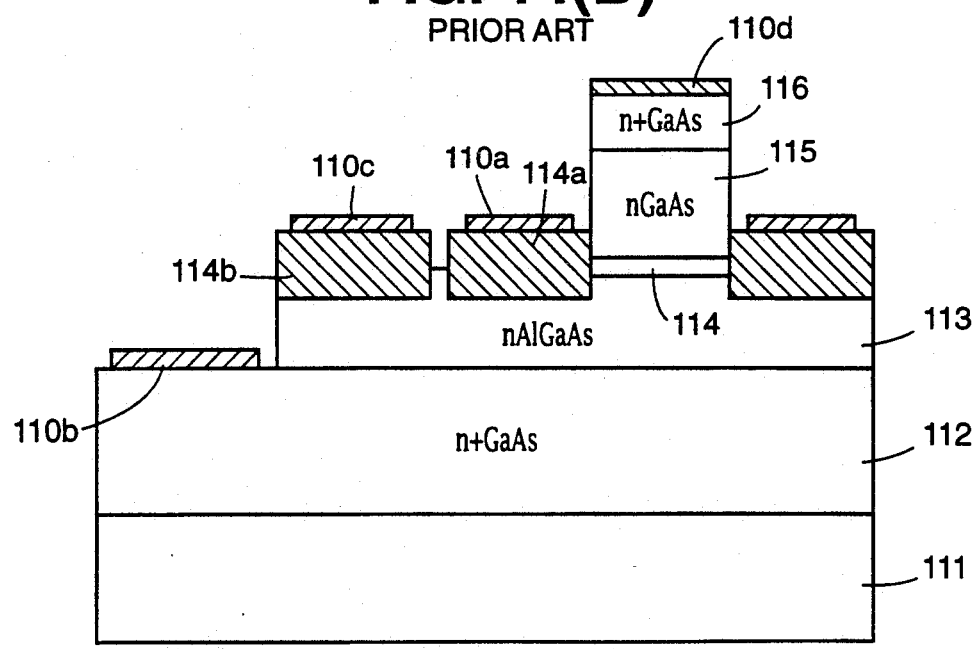
FIG. 14(B) is a major cross sectional view of the prior art $I^2L$ gate.

FIG. 9(A) is an equivalent circuit diagram of an I$^2$L gate embodied according to an integration method of a second embodiment of the present invention; and FIG. 9(B) is a major cross sectional view of an embodiment of the I$^2$L gate. This embodiment is different from the prior art device as shown in FIG. 14 in that a material system of $In_xAl_{1-x}As/In_xGa_{1-x}As$ lattice matched to an InP substrate is used and a collector top type pnp HBT is used as a switching transistor and a lateral npn BT as a current injunction source. FIG. 9(B) illustrates an epitaxial growth structure on the InP substrate 11, which structure includes p-type InGaAs 12, P-type InAlAs 13, n-type InGaAs 14, P-type InAlAs 15 and p$^+$-type InGaAs 16. The collector top type HBT is implemented with the P-type InAlAs 13, the n-type InGaAs 14 and the P-type InAlAs 15, while the lateral npn BT is implemented with a collector region 14a, the P-type InAlAs 13 and an emitter region 14b.

Through the use of the InGaAs/InAlAs in the above arrangement, the resulting collector top type PnP HBT may show a sufficient difference between the ON voltage V2 of the external base-emitter diode and the ON voltage V1 of the intrinsic base-emitter diode, making it possible to turn ON the intrinsic base-emitter diode only, with no decrease in current gain.

The collector region of the BT may be spaced away from the emitter region of the BT, because of the utilization of the lateral npn BT where the diffusion length of the minority carriers in the base is relatively long.

FIGS. 11(A) to 11(D) illustrate a manufacturing sequence of an I$^2$L gate embodying the present invention. Referring to FIGS. 11(A) to 11(D), a method of manufacturing the I$^2$L gate will be discussed. By the molecular epitaxial growth technique, there is disposed on a semi-insulating InP substrate 1 a sequential stack including a first contact layer 12 of p type In$_{0.53}$Ga$_{0.47}$As of a thickness of 500 nm including a p type impurity of $4 \times 10^{19}$/cm$^3$, an emitter layer 13 of p type In$_{0.53}$Al$_{0.47}$As of a thickness of 300 nm including a p type impurity of $5 \times 10^{17}$/cm$^3$, a base layer 14 of n type In$_{0.53}$Ga$_{0.47}$As of a thickness of 15 nm including a n type impurity of $1 \times 10^{19}$/cm$^3$, a collector layer 15 of p type In$_{0.53}$Ga$_{0.47}$As of a thickness of 200 nm including a p type impurity of $5 \times 10^{16}$/cm$^3$, and a second contact layer 16 of p type In$_{0.53}$Ga$_{0.47}$As of a thickness of 100 nm including a p type impurity of $4 \times 10^{19}$/cm$^3$.

Then, a tungsten silicide (WSi) is vapor deposited by the sputtering technology and SiO$_2$ is deposited by a reduced pressure CVD device. While a patterned photoresist is used as a mask, an emitter electrode 17a and a dummy insulating layer 18a both of WSi are defined in an emitter region of the pnp HBT and a dummy electrode 17b and a dummy insulating layer 18b both of WSi are defined in a base region of the lateral npn BT. See FIG. 11(A).

The second contact layer 16 and the collector layer 15 are partially etched with a solution of phosphoric acid and hydrogen peroxide, using the dummy insulating layer 18a and the dummy insulating layer 18b as mask. The next step is to implant Si ions at an acceleration voltage of 100 KV and a dozing of $10^{14}$/cm$^3$, followed by thermal treatment at 600° C. for 10 seconds. This results in the p type In$_{0.53}$Ga$_{0.47}$As layer remaining as part of the collector layer 15 and the p type In$_{0.52}$Ga$_{0.48}$As layer underneath the base layer 14 are turned to n type, forming the external base region of the HBT or the collector region 14a of the BT and the emitter region 14b of the BT. See FIG. 11(B).

The following step is to remove only the dummy insulating layer 18a by hydrogen fluoride and apply a photoresist to the whole surface. The smoothing process by the oxygen plasm etching technique exposes the dummy insulating layer 18b and hydrogen fluoride removes the dummy insulating layer 18b. The dummy electrode 17b is removed by the CHF$_3$ gas reactive ion etching technique and the second contact layer 16, the collector layer 15 and the base layer 14 beneath the dummy electrode 17b are removed by an etchant of phosphoric acid. cf. FIG. 11(C).

Figure 11A:
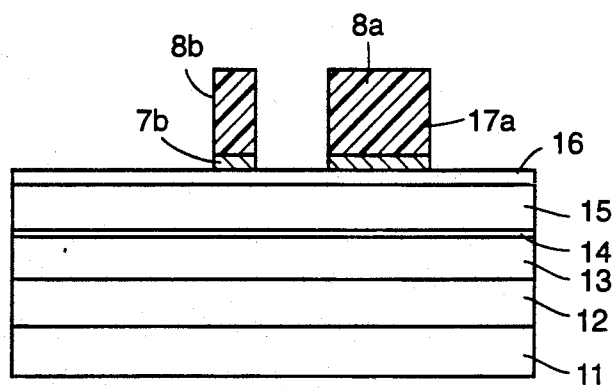
FIGS. 11(A) to 11(D) illustrate a manufacturing sequence of an $I^2L$ gate as a semiconductor device embodying the present invention.
Figure 11B:
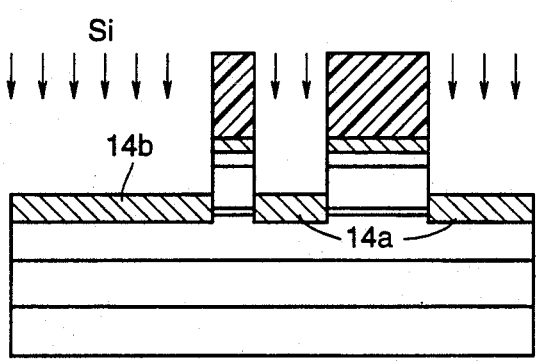
Figure 11C:
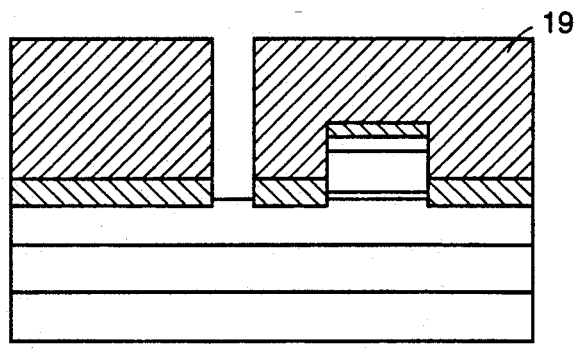
Figure 11D:
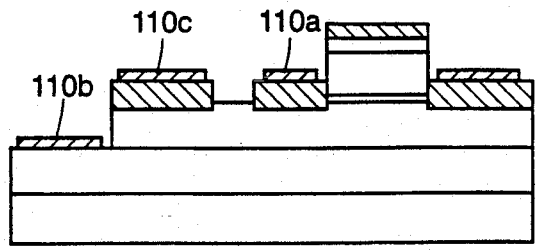

Finally, after removal of the photoresist 19, a base mesa structure is formed with an etchant of phosphoric acid. A base electrode of the HBT or collector electrode 110a of the BT and an emitter electrode of the HBT or base electrode of the BT 110b, a base electrode 19b and a collector 110c of the BT are deposited. FIG. 11(D).

As discussed previously, the collector top type pnp HBT and the lateral npn BT are formed in juxtaposition with each other, using the dummy insulating layer 18b and the dummy electrode 17b, whereby the manufacturing process is simplified without the need for any extra process.

The electron mobility of the base layer of the n type In$_{0.53}$Ga$_{0.47}$As is about 20 times higher than the hole mobility when the p type GaAs corresponding to the base layer of the npn type heterojunction bipolar transistor contains an impurity of typically 10$^{19}$/cm$^3$. As a consequence, the base resistance at the intrinsic region with a thin thickness of the base will not increase and the apparent base thickness of the external base region will increase due to ion implantation process, thus attaining a reduction of the total base resistance. Even when the intrinsic base thickness is very thin, precise etching control is not necessary because of the Si ion implantation process for converting the collector layer 15 into the n type while remaining a portion thereof.

While the In$_{0.53}$Ga$_{0.47}$As and In$_{0.52}$Al$_{0.48}$As lattice matched to the InP substrate are used in the above mentioned embodiments of the present invention, no deterioration of transistor characteristics would be experienced if lattice mismatching stands within the range of 0.3%.

Although the present invention is described in terms of specific embodiments, it will be clear that various changes in the structure and procedures can be made within the scope of the invention as limited only by the included claims.

The embodiments of this invention in which an exclusive property or privilege is claimed are defined as follows.

I claim:

1. A heterojunction bipolar transistor comprising:
   (a) an InP substrate and
   (b) a collector or emitter layer of p type In$_x$Al$_{1-x}$As lattice matched to the InP substrate,
   (c) a base layer of n type In$_x$Ga$_{1-x}$As
   (d) an emitter or collector layer of p type In$_x$Al$_{1-x}$As lattice matched to the InP substrate,
   said collector or emitter layer of p type In$_x$Al$_{1-x}$As, said base layer of n type In$_x$Ga$_{1-x}$As and said emitter or collector layer of p type In$_x$Al$_{1-x}$As being formed in an epitaxial layered structure on said InP substrate, said heterojunction bipolar transistor further comprising:
   (e) an external base region comprising an n type In$_x$Ga$_{1-x}$As layer contiguous to said base layer of n type In$_x$Ga$_{1-x}$As and an n type In$_x$Al$_{1-x}$As layer contiguous to said emitter or collector layer of p type In$_x$Al$_{1-x}$As, said n type In$_x$Al$_{1-x}$As layer being formed by introduction of an n type impurity into said p type In$_x$Al$_{1-x}$As layer beneath said base layer and resulting conversion of the conductivity type of the In$_x$Al$_{1-x}$As layer from p type to n type.

2. A heterojunction bipolar transistor according to claim 1 further comprising:
   (a) a spacer layer of p type In$_x$Ga$_{1-x}$As interposed between said collector or emitter layer of the p type In$_x$Al$_{1-x}$As lattice matched to said InP substrate and said base layer of the n type In$_x$Ga$_{1-x}$As or between said base layer of the n type In$_x$-

$Ga_{1-x}As$ and said emitter or collector layer of the p type $In_xAl_{1-x}As$.

3. A heterojunction bipolar transistor comprising:
(a) an InP substrate and
(b) an epitaxial layered structure on said InP substrate, said epitaxial layered structure including
(c) a collector or emitter layer of p type $In_xAl_{1-x}As$ lattice matched to said InP substrate,
(d) a first spacer layer of p type $In_xGa_{1-x}As$
(e) a base layer of n type $In_xGa_{1-x}As$ and
(f) a second spacer layer of p type $In_xGa_{1-x}As$
(g) an emitter or collector layer of p type $In_xAl_{1-x}As$ lattice matched to the InP substrate,
said heterojunction bipolar transistor further comprising:
(h) an external base region comprising an n type $In_x Ga_{1-x}As$ layer contiguous to said base layer of n type $In_xGa_{1-x}As$ and an n type $In_xAl_{1-x}As$ layer contiguous to said emitter or collector layer of p type $In_xAl_{1-x}As$, said n type $In_xAl_{1-x}As$ layer being formed by introduction of an n type impurity into said p type $In_xAl_{l-x}As$ layer beneath said base layer and resulting conversion of the conductivity type of the $In_xAl_{l-x}As$ layer from p type to n type.

4. A heterojunction bipolar transistor according to claim 1 or 2 or 3 wherein the composition ratio x of the indium (In) in said base layer of the n type $In_xGa_{l-x}As$ is increased (i.e., x>0.53) to bring about lattice mismatching of the base layer with the InP substrate, and wherein the thickness of said base layer is selected not to develop a dislocation.

5. A plurality of the heterojunction bipolar transistors according to claims 1, 2, 3 or 4, wherein said plurality of the heterojunction bipolar transistors are integrated on the common collector or emitter region of the p type $In_xAl_{l-x}As$ at the lowest layer, and wherein some of said transistors serve as emitter top type and others as collector top type.

6. An integrated semiconductor device comprising:
(a) a collector top type pnp heterojunction bipolar transistor (HBT) and
(b) a lateral npn bipolar transistor (BT), wherein said collector top type pnp HBT comprises:
(c) an InP substrate and
(d) an epitaxial layered structure on said InP substrate, said epitaxial layered structure including
(e) an emitter layer of p type $In_xAl_{l-x}As$ matching in lattice at least with said InP substrate;
(f) a base layer of n type $In_xGa_{l-x}As$ and
(g) a collector layer of p type $In_xGa_{l-x}As$ or p type $In_xAl_{l-x}As$ lattice matched to the InP substrate, said collector top type pnp heterojunction bipolar transistor (HBT) further comprising:
(h) an external base region comprising an n type $In_x Ga_{l-x}As$ layer contiguous to said base layer of n type $In_xGa_{l-x}As$ and an n type $In_xAl_{l-x}As$ layer contiguous to said emitter or collector layer of p type $In_xAl_{l-x}As$, said n type $In_xAl_{l-x}As$ layer being formed by introduction of an n type impurity into said p type $In_xAl_{l-x}As$ layer beneath said base layer and resulting conversion of the conductivity type of the $n_xAl_{l-x}As$ layer from p type to n type, and wherein the lateral npn BT where electrons run laterally, comprises
(i) a base region of p type $In_xAl_{l-x}As$ interposed between said two n type $In_xAl_{l-x}As$ regions, and
(j) a collector or emitter formed of n type $In_x Al_{l-x}As$.

7. An integrated semiconductor device according to claim 6 wherein the base of said pnp HBT is common to the collector of said lateral npn BT and wherein said pnp HBT is used as a switching transistor and said lateral npn BT as a current injection source.

8. A heterojunction bipolar transistor comprising:
(a) an InP substrate and
(b) an epitaxial layered structure on said InP substrate, said epitaxial layered structure including
(c) a collector or emitter layer of p type $In_xAl_{l-x}As$,
(d) a base layer of n type $In_xGa_{l-x}As$ and
(e) an emitter or collector layer of p type $In_xAl_{l-x}As$, said heterojunction bipolar transistor further comprising:
(f) an external base region comprising an n type $In_x Ga_{l-x}As$ layer contiguous to said base layer of n type $In_xGa_{l-x}As$ and an n type $In_xAl_{l-x}As$ layer contiguous to said emitter or collector layer of p type $In_xAl_{l-x}As$, said n type $In_xAl_{l-x}As$ layer being formed by introduction of an n type impurity into said p type $In_xAl_{l-x}As$ layer beneath said base layer and resulting conversion of the conductivity type of the $In_xAl_{l-x}As$ layer from p type to n type.

9. A symmetric structure PnP type heterojunction bipolar transistor comprising:
(a) an $In_xAl_{l-x}As/In_xGa_{l-x}As$ PnP type system lattice matched to an InP substrate,
(b) an intrinsic base-emitter diode formed in said $In_x Al_{l-x}As/In_xGa_{l-x}As$ PnP type system;
(c) a base-emitter diode formed in a wide-gap semiconductor material by introducing into an external base region an n type impurity, thereby forming said external base region by an n type $In_xGa_{l-x}As$ layer and an n type $In_xAl_{l-x}As$ layer, said n type $In_xAl_{l-x}As$ layer being formed by introduction of said n type impurity into p type $In_xAl_{l-x}As$ layer beneath the intrinsic base-emitter diode and resulting conversion of the conductivity type of the $In_xAl_{l-x}As$ layer from p type to n type,
wherein the built-in voltage in said external base-emitter diode formed in the wide-gap semiconductor material is substantially higher than the built-in voltage of the intrinsic base-emitter diode.

10. A heterojunction bipolar transistor comprising:
(a) a semi-insulating InP substrate;
(b) a sequential stack disposed on said InP substrate; said sequential stack including
(c) a first contact layer of p type $In_{0.53}Ga_{0.47}As$ of a thickness of 500 nm including a p type impurity of $4 \times 10^{19}/cm^3$,
(d) a collector or emitter layer of p type $In_{0.53}Al_{0.47}As$ of a thickness of 200 nm including a p type impurity of $2 \times 10^{17}/cm^3$,
(e) a first spacer layer of p type $In_{0.53}Ga_{0.47}As$ of a thickness of 30 nm including a p type impurity of $2 \times 10^{17}/cm^3$,
(f) a base layer of n type $In_{0.53}Ga_{0.47}As$ of a thickness of 15 nm including a n type impurity of $1 \times 10^{19}/cm^3$,
(g) a second spacer layer of p type $In_{0.53}Ga_{0.47}As$ of a thickness of 30 nm including a p type impurity of $2 \times 10^{17}/cm^3$,
(h) a collector or emitter layer of p type $In_{0.53}Ga_{0.47}As$ of a thickness of 200 nm including a p type impurity of $2 \times 10^{17}/cm^3$, and
(i) a second contact layer of p type $In_{0.53}Ga_{0.47}As$ of a thickness of 100 nm including a p type impurity of $4 \times 10^{19}/cm^3$.

11. A heterojunction bipolar transistor according to claim 10 wherein the thickness of said spacer layers is selected so as to develop a depletion layer and maintain an n-InGaAs/p-InAlAs heterojunction even when there is applied a forward bias between the base layer and the collector or emitter layer or between the base layer and the emitter or collector layer.

12. A heterojunction bipolar transistor according to claim 10 wherein said first spacer layer is eliminated and the doping concentration of said collector or emitter layer is selected to be $7 \times 10^{17}/cm^2$.

13. A ternary compound heterojunction bipolar transistor comprising:
  (a) a substrate;
  (b) a collector or emitter layer of a first compound having a first conductivity type, formed on said substrate;
  (c) a first spacer layer of a second compound doped with a first conductivity type dopant, formed on said collector or emitter layer;
  (d) a base layer of the second compound having a second conductivity type, formed on said first spacer layer;
  (e) a second spacer layer of the second compound doped with the first conductivity type dopant, formed on said base layer;
  (f) an emitter or collector layer of the first compound having the first conductivity type, formed on said second spacer layer,
  wherein said base layer is sandwiched between the first and second spacer layers doped with the opposite conductivity type dopant and the resulting heterojunction bipolar transistor is of a symmetric structure operable in either emitter top mode or collector top mode.

* * * * *